(12) United States Patent
Ogura et al.

(10) Patent No.: US 8,298,452 B2
(45) Date of Patent: Oct. 30, 2012

(54) NEGATIVE TYPE RESIST COMPOSITION FOR COLOR FILTER, COLOR FILTER USING SAME, AND LIQUID CRYSTAL DISPLAY

(75) Inventors: Michihiro Ogura, Tokyo-to (JP); Yoshihito Maeno, Tokyo-to (JP); Hiroaki Segawa, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 315 days.

(21) Appl. No.: 12/194,637

(22) Filed: Aug. 20, 2008

(65) Prior Publication Data

US 2009/0108241 A1 Apr. 30, 2009

(30) Foreign Application Priority Data

Sep. 27, 2007 (JP) .................. 2007-250571

(51) Int. Cl.
*G02B 5/23* (2006.01)
*G02F 1/1335* (2006.01)

(52) U.S. Cl. ..................... 252/586; 106/31.28; 349/106; 359/885; 430/270.1; 430/284.1; 430/286.1; 430/287.1; 430/311; 430/950

(58) Field of Classification Search .................. 252/586; 430/311, 281.1, 286.1, 287.1, 319, 325, 907, 430/270.1, 284.1, 905; 106/31.28; 349/106; 359/885

See application file for complete search history.

(56) References Cited

U.S. PATENT DOCUMENTS

| | | | | |
|---|---|---|---|---|
| 4,755,563 A | * | 7/1988 | West .............................. | 525/287 |
| 5,407,581 A | * | 4/1995 | Onodera et al. .............. | 210/654 |
| 5,998,091 A | * | 12/1999 | Suzuki ........................ | 430/270.1 |
| 6,117,613 A | * | 9/2000 | Kawauchi et al. .......... | 430/270.1 |
| 6,455,207 B1 | * | 9/2002 | Katoh et al. ..................... | 430/7 |
| 2006/0194149 A1 | * | 8/2006 | Yamasaki et al. .......... | 430/270.1 |

FOREIGN PATENT DOCUMENTS

| | | |
|---|---|---|
| JP | 2002-31713 | 1/2002 |
| JP | 2006-343648 A | 12/2006 |

\* cited by examiner

*Primary Examiner* — Bijan Ahvazi
(74) *Attorney, Agent, or Firm* — Ladas & Parry LLP

(57) ABSTRACT

A negative type resist composition for a color filter including (A) a pigment dispersant, (B) a pigment, (C) an alkaline-soluble resin, (D) a polyfunctional monomer, (E) a photo initiator and (F) a solvent.

15 Claims, 1 Drawing Sheet

NEGATIVE TYPE RESIST COMPOSITION FOR COLOR FILTER, COLOR FILTER USING SAME, AND LIQUID CRYSTAL DISPLAY

BACKGROUND OF THE INVENTION

1. Field of the Invention

The present invention relates to a negative type resist composition for a color filter, which has excellent pigment dispersibility and alkaline developability.

2. Description of the Related Art

With development in personal computers, particularly with development in portable personal computers, demands for liquid crystal displays have recently been increasing. In addition, the penetration rate of household liquid crystal televisions has been also recently rising, so that the market of the liquid crystal displays has been expanding. Further, the screens of the liquid crystal displays having spread in these days tend to become larger. Particularly, as to the household liquid crystal televisions, this tendency is getting stronger. Under the circumstances, it is desired that high quality parts for the liquid crystal displays are produced at a lower cost with high productivity. Such a desire is increasing, because color filters having a function to perform color-displaying of liquid crystal displays have been high-cost item.

Here, as a general method for producing an color filter, a method is used, wherein a coated film made of a photo curable resist composition having each color pigment dispersed therein is formed on a substrate where a light-shielding portion is formed in pattern, and a color layer for each color is formed in pattern by subjecting the substrate to exposure and alkaline development via a photo mask having a desired pattern shape.

As the photo curable resist composition to be used for producing such a color filter, a composition comprising a pigment dispersant to be added for uniformly dispersing the pigment, an alkaline-soluble resin, a polyfunctional monomer, a photo initiator and a solvent in addition to the above mentioned pigment for each color is usually employed. As the pigment dispersant to be used in such a photo curable resist composition, a dispersant exhibiting excellent dispersibility is used, because if the dispersibility of the pigment in obtaining the color layer for the color filter is insufficient, problems such as color unevenness may occur in the color layer. As the photo curable resist composition using the pigment dispersant with such excellent dispersibility, a color filter composition using an A-B block copolymer and/or a B-A-B block copolymer, in which an A block has a quaternary ammonium base at side chains and a B block has no such a quaternary ammonium base at side chains as the pigment dispersant, is disclosed as a pigment dispersant (Japanese Patent Application Publication (JP-A) 2002-31713).

Further, a demand for enhancing the contrast ratio of the liquid crystal display apparatuses has been recently increasing, and the pigments are required to be made finer so as to realize such a demand. Owing to this, the surface area of the pigment in the above photo curable resist composition becomes bigger, and that addition amount of the pigment dispersant which is required to uniformly disperse the pigment needs to be increased.

However, as to the conventional type pigment dispersant containing the quaternary ammonium base as disclosed in JP-A 2002-31713, the uniform dispersibility of the pigment can be ensured by increasing the addition amount thereof. On the other hand, there are problems that the alkaline developability decreases, the time period required for the alkaline development becomes longer and the non-exposed photo curing resist composition remains on the substrate, the productivity and quality unfavorably drop.

SUMMARY OF THE INVENTION

The present invention has been accomplished in view of the above-mentioned problems, and is aimed mainly at providing a negative type resist composition for a color filter, which has excellent pigment dispersibility and alkaline developability.

In order to solve the above problems, the present invention provides a negative type resist composition for a color filter, comprising (A) a pigment dispersant, (B) a pigment, (C) an alkaline-soluble resin, (D) a polyfunctional monomer, (E) a photo initiator and (F) a solvent, wherein the pigment dispersant (A) is a block copolymer comprising a constituting unit (1) represented by the following general formula (I) and a constituting unit (2) represented by the following general formula (II), and further wherein an amino group possessed by the constituting unit (1) and an acidic organic phosphorus compound represented by the general formula (III) form a salt.

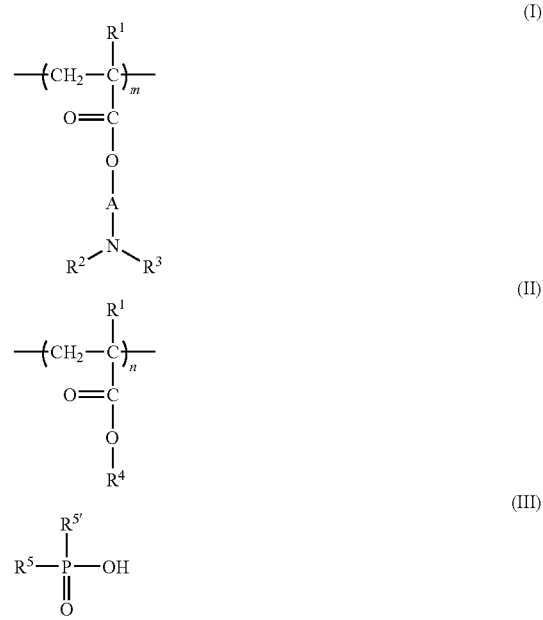

In the above formulae (I) to (III), $R^1$ is a hydrogen atom or a methyl group; $R^2$ and $R^3$ each and independently denote a hydrogen atom or a C1 to C8 alkyl group; A is a C1 to C8 alkylene group or a divalent group represented by —[CH($R^6$)—CH($R^7$)—O)]$_x$—CH($R^6$)—CH($R^7$)— or [(CH$_2$)$_y$—O]$_z$—(CH$_2$)$_y$—; $R^4$ is a C1 to C18 alkyl group, a benzyl group, a phenyl group, a biphenyl group, —[CH($R^6$)—CH($R^7$)—O]$_x$—$R^8$ or —[(CH$_2$)$_y$—O]$_z$—$R^8$; $R^5$, $R^{5'}$ each and independently denote a hydrogen atom, a hydroxyl group, a C1 to C18 alkyl group, a C2 to C18 alkenyl group, a benzyl group, a phenyl group, a biphenyl group or a monovalent group represented by —[CH($R^9$)—CH($R^{10}$)—O]$_a$—$R^{11}$ or —[(CH$_2$)$_b$—O]$_c$—$R^{11}$ or —O—$R^{5''}$;

$R^{5''}$ is a C1 to O18 alkyl group, a C2 to C18 alkenyl group, a benzyl group, a phenyl group, a biphenyl group or a monovalent group represented by —[CH($R^9$)—CH($R^{10}$)—O]$_a$—$R^{11}$ or —[(CH$_2$)$_b$—O]$_c$—$R^{11}$;

$R^6$, $R^7$, $R^9$ and $R^{10}$ each and independently denote a hydrogen atom or a methyl group; $R^8$ and $R^{11}$ each and independently denote a hydrogen atom, a C1 to C18 alkyl group, a benzyl group, a phenyl group, a biphenyl group or a monovalent group represented by —CHO, —CH$_2$CHO, —CO—CH═CH$_2$, —CO—C(CH$_3$)═CH$_2$ or —CH$_2$COOR$^{12}$, provided that each group of $R^8$ and $R^{11}$ may have a substituent group; $R^{12}$ is a hydrogen atom or a C1 to C5 alkyl group;

"x" and "a" denote integers of 0 to 18, "y" and "b" denote integers of 1 to 5, "z" and "c" denote integers of 0 to 18, and "m" and "n" denote integers of 1 to 200.

According to the present invention, the above pigment dispersant is the block copolymer, wherein the constituting unit (1) represented by the above general formula (I) and the structural unit (2) represented by the above general formula (II) are comprised, and further wherein the salt is formed by the amino group possessed by the above constituting unit (1) and the acidic organic phosphorus compound represented by the above general formula (III). Thereby, adsorbability of the above constituting unit (1) forming the salt-forming site to the pigment is enhanced, and the constituting unit (2) has excellent compatibility with the above solvent, so that the pigment is stabilized in the above solvent and thus the dispersibility and the stability of the above pigment can be made excellent.

Further, since the resist composition has the acidic organic phosphorus compound represented by the above general formula (III), the salt-forming site formed by the amino group contained in the above constituting unit (1) and the above acidic organic phosphorus compound has a high solubility to an aqueous alkaline solution at the time of the alkaline development, so that excellent alkaline developability can be exhibited. Therefore, when a color filter is produced by using the negative type resist composition for the color filter according to the present invention, the alkaline developing time period can be shortened with excellent productivity. In addition, since the alkaline developability is excellent, a high-quality color filter having a small residue of the negative type resist composition for the color filter at non-exposed portions can be obtained.

In the present invention, $R^5$ and $R^{5\prime}$ contained in the above acidic organic phosphorus compound preferably contain polymerizable groups, and the polymerizable group is preferably a vinyl group, a (metha)acryloyl group or an allyl group. When the polymerizable group is contained in the above acidic organic phosphorous compound, polymerization can be easily performed between such polymerizable groups and/or among the polymerizable groups, the alkaline-soluble resin and the polyfunctional monomers and the like contained in the negative type resist composition for the color filter according to the present invention at the time of exposing in forming the color layer with use of the negative type resist composition for the color filter of the present invention, and the above pigment dispersant can be stably present in the color layer of the color filter. Therefore, when the liquid crystal display is produced by using such a color filter, the pigment dispersant can be prevented from bleeding out into other members such as the liquid crystal layer.

When the polymerizable groups possessed by the above acidic organic phosphorous compound are polymerized before the color layer is formed, the negative type resist composition for the color filter at non-exposed positions can be made particularly excellent in the alkaline developability.

In the present invention, the average particle diameter of the above pigment (B) is preferably 10 nm to 100 nm. When the particle diameters of the above pigment fall in the range of 10 nm to 100 nm, the liquid crystal display having high contrast and high quality can be produced with the color filter using the negative type resist composition for the color filter according to the present invention.

The present invention also provides a color filter comprising a color layer formed by using the above negative type resist composition for the color filter.

According to the present invention, since the alkaline developability can be made excellent by forming the color layer with the negative type resist composition for the color filter, the color filter having excellent productivity can be attained. Further, since the resist composition has excellent alkaline developability, the high-quality color filter having less residue of the negative type resist composition for the color filter at the non-exposed positions can be obtained.

The present invention is to provide a liquid crystal display characterized by having the above color filter. According to the present invention, the high-quality liquid crystal display can be obtained at excellent productivity.

DESCRIPTION OF PREFERRED EMBODIMENTS

Figure 1:
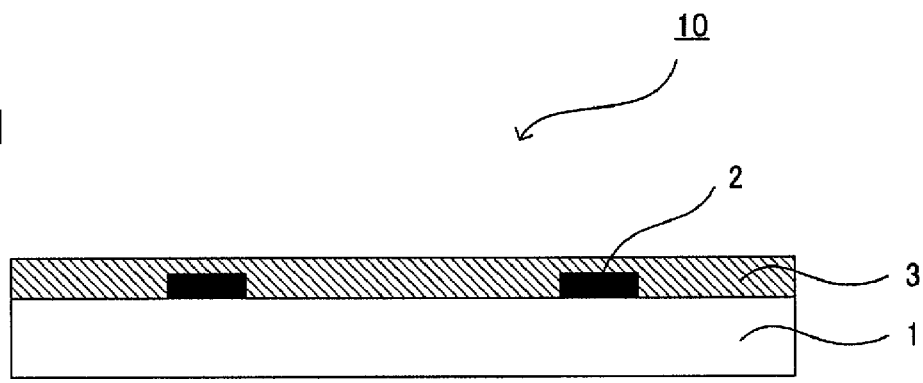
FIG. 1 is a schematic view illustrating one embodiment of the color filter according to the present invention.

In the following, the negative type resist composition for the color filter, the color filter and the liquid crystal display according to the present invention will be explained.

First, the negative type resist composition for the color filter according to the present invention will be explained.

[Negative Type Resist Composition for a Color Filter]

The negative type resist composition for the color filter (hereinafter sometimes referred to simply as the negative type resist composition) according to the present invention comprises (A) a pigment dispersant, (B) a pigment, (C) an alkaline-soluble resin, (D) a polyfunctional monomer and (E) a photo initiator and (F) a solvent, and further the above pigment dispersant (A) has the following properties.

((A) Pigment Dispersant)

In the negative type resist composition according to the present invention, a pigment dispersant to be used as the component (A) is the block copolymer (hereinafter sometimes referred to also as "salt type block copolymer"), wherein a constituting unit (1) represented by the following general formula (I) and a constituting unit (2) represented by the following general formula (II) are comprised, and further wherein a salt is formed by an amino group possessed by the above constituent unit (1) and an acidic organic phosphorus compound represented by the following general formula (III).

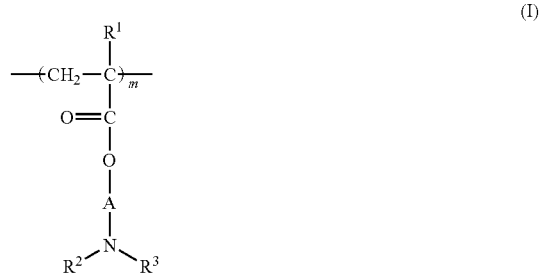

-continued

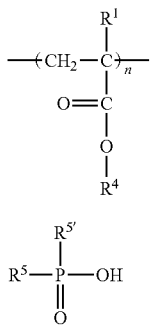
(II)

$$R^5-\underset{\underset{O}{\|}}{\overset{\overset{R^{5'}}{|}}{P}}-OH \quad (III)$$

In the above formulae (I) to (III), $R^1$ is a hydrogen atom or a methyl group; $R^2$ and $R^3$ each and independently denote a hydrogen atom or a C1 to C8 alkyl group; A is a C1 to C8 alkylene group or a divalent group represented by —[CH($R^6$)—CH($R^7$)—O]$_x$—CH($R^6$)—CH($R^7$)— or [(CH$_2$)$_y$—O]$_z$—(CH$_2$)$_y$—; $R^4$ is a C1 to C18 alkyl group, a benzyl group, a phenyl group, a biphenyl group, —[CH($R^6$)—CH($R^7$)—O]$_x$—$R^8$ or —[(CH$_2$)$_y$—O]$_z$—$R^8$, $R^5$, $R^{5'}$ each and independently denote a hydrogen atom, a hydroxyl group, a C1 to C18 alkyl group, a C2 to C18 alkenyl group, a benzyl group, a phenyl group, a biphenyl group or a monovalent group represented by —[CH($R^9$)—CH($R^{10}$)—O]$_a$—$R^{11}$ or —[(CH$_2$)$_b$—O]$_c$—$R^{11}$ or —O—$R^{5''}$;

$R^{5''}$ is a C1 to C18 alkyl group, a C2 to O18 alkenyl group, a benzyl group, a phenyl group, a biphenyl group or a monovalent group represented by —[CH($R^9$)—CH($R^{10}$)—O]$_a$—$R^{11}$ or —[(CH$_2$)$_b$—O]$_c$—$R^{11}$;

$R^6$, $R^7$, $R^9$ and $R^{10}$ each and independently denote a hydrogen atom or a methyl group; $R^8$ and $R^{11}$ each and independently denote a hydrogen atom, a C1 to C18 alkyl group, a benzyl group, a phenyl group, a biphenyl group or a monovalent group represented by —CHO, —CH$_2$CHO, —CO—CH=CH$_2$, —CO—C(CH$_3$)=CH$_2$ or —CH$_2$COOR$^{12}$, provided that each group of $R^8$ and $R^{11}$ may have a substituent group; $R^{12}$ is a hydrogen atom or a C1 to C5 alkyl group;

"x" and "a" denote integers of 0 to 18, "y" and "b" denote integers of 1 to 5, "z" and "c" denote integers of 0 to 18, and "m" and "n" denote integers of 1 to 200.

According to the present invention, the above pigment dispersant is the block copolymer, wherein the constituting unit (1) represented by the above general formula (I) and the structural unit (2) represented by the above general formula (II) are comprised, and further wherein the salt is formed by the amino group possessed by the above constituting unit (1) and the acidic organic phosphorus compound represented by the above general formula (III). Thereby, adsorbability of the above constituting unit (1) forming the salt-forming site to the pigment is enhanced, and the constituting unit (2) has excellent compatibility with the above solvent, so that the pigment is stabilized in the above solvent and thus the dispersibility and the stability of the above pigment can be made excellent.

Further, since the resist composition has the acidic organic phosphorus compound represented by the above general formula (III), the salt-forming site formed by the amino group contained in the above constituting unit (1) and the above acidic organic phosphorus compound has a high solubility to an aqueous alkaline solution at the time of the alkaline development, so that excellent alkaline developability can be exhibited. Therefore, when a color filter is produced by using the negative type resist composition for the color filter according to the present invention, the alkaline developing time can be shortened with excellent productivity. In addition, since the alkaline developability is excellent, a high-quality color filter having a small residue of the negative type resist composition for the color filter at non-exposed portions can be obtained.

<Block Copolymer>

The block copolymer in the pigment dispersant, which is composed of the salt type block copolymer, comprises the constituent unit (1) represented by the above general formula (I) and the constituent unit (2) represented by the above general formula (II).

In the above general formula (II), $R^4$ denotes a C1 to C18 alkyl group, a benzyl group, a phenyl group, and biphenyl group, —[CH($R^6$)—CH($R^7$)—O]$_x$$R^8$ or —[(CH$_2$)$_y$—O]$_z$—$R^8$. If the $R^4$ has an aromatic ring, it may possess an appropriate substituent group on the aromatic ring such as a C1 to C4 linear or branched alkyl group.

In the present invention, the above $R^2$ and $R^3$ may be identical with or different from each other.

A is a C1 to C8 alkylene group or a divalent group represented by —[CH($R^6$)—CH($R^7$)—O]$_x$—CH($R^6$)—CH($R^7$)— or [(CH$_2$)$_y$—O]$_z$—(CH$_2$)$_y$—. Here, the above C1 to C8 alkylene group may be in either a linear form or a branched-chain form. For example, there are a methylene group, an ethylene group, a trimethylene group, a propylene group, various butylene groups, various pentylene groups, various hexylene groups, and various octylene groups.

$R^6$ and $R^7$ are each and independently a hydrogen atom or a methyl group.

The reference "x" is an integer of 0 to 18, and preferably an integer of 0 to 4, and more preferably an integer of 0 to 2, whereas "y" is an integer of 1 to 5, and preferably an integer of 1 to 4, and more preferably 2 or 3. The reference "z" is an integer of 0 to 4, preferably an integer of 0 to 2. In the present invention, if "x", "y" and "z" are within the above ranges, the negative type resist composition for the color filter according to the present invention has excellent pigment dispersibility.

As the A, a C1 to C8 alkylene group is preferable, and a methylene group and an ethylene group are more preferable. If the number of carbons is within 1 to 8, the dispersibility of the pigment can be kept excellent.

The above $R^6$ and $R^7$ are the same as mentioned above, and $R^8$ is a hydrogen atom or a C1 to C18 alkyl group, a benzyl group, a phenyl group, a biphenyl group, a monovalent group represented by —CHO, —CH$_2$CHO, —CO—CH=CH$_2$, —CO—C(CH$_3$)=CH$_2$ or —CH$_2$COOR$^{12}$, provided that each group of the $R^8$ may have a substituent group. $R^{12}$ is a hydrogen atom or a C1 to C5 straight, branched or cyclic alkyl group.

The above C1 to C18 alkyl group may be in any of a linear form, a branched-chain form or a cyclic form. For example, a methyl group, an ethyl group, a n-propyl group, an isopropyl group, a n-butyl group, an isobutyl group, a sec.-butyl group, a tert.-butyl group, various pentyl groups, various hexyl groups, various octyl groups, various decyl groups, various dodecyl groups, various tetradodecyl groups, various hexadecyl groups, various octadecyl groups, a cyclopentyl group, a cyclohexyl group, a cyclooctyl group, a cyclododecyl group, a bornyl group, an isobornyl group, a dicyclopentanyl group, an adamantyl group, and a lower alkyl group-substituted adamantyl group.

The above $R^6$ and $R^7$ are the same as mentioned above, and $R^8$ is a hydrogen atom or a C1 to C18 alkyl group, a benzyl group, a phenyl group, a pyridyl group, a biphenyl group, a pyridyl phenyl group, a monovalent group represented by —CHO, —CH$_2$CHO, —CO—CH=CH$_2$, —CO—C(CH$_3$)=CH$_2$ or —CH$_2$COOR$^{12}$, provided that each group of the $R^8$ may have a substituent group. $R^{12}$ is a hydrogen atom or a C1 to C5 straight, branched or cyclic alkyl group.

The above $R^8$ may have a substituent group, and as the substituent group, a linear, branched or cyclic C1 to C4 alkyl group, a halogen atom such as F, Cl, or Br can be recited, for example.

Among the $R^8$ groups, the C1 to C18 alkyl group is as shown in the above $R^4$.

In the $R^4$, "x", "y" and "z" are as explained in the above A.

In the present invention, as the above $R^4$, one having good solubility to the below-mentioned solvents is preferably used. More particularly, although depending upon factors such as the constituent unit constituting the above block copolymer, a methyl group, an ethyl group, a benzyl group or the like is preferably used when the above solvent is tetrahydrofuran, toluene or the like, whereas when the above solvent is a less polar solvent such as pentane or hexane, a pentyl group, a hexyl group, a heptyl group or the like is preferably used.

The reason why the above $R^4$ is set here like this is that the constituting unit (2) containing the above $R^4$ has solubility to the above solvents and the salt-forming site formed by the amino group of the above constituent unit (1) and the below-mentioned acidic organic phosphorus compound has a high adsorbability to the pigment, and consequently the dispersibility and the stability of the pigment can be particularly made excellent.

In addition, the above $R^4$ may be substituted by a substituent group such as an alkoxy group, a hydroxyl group, a carboxyl group, an amino group, an epoxy group, or a hydrogen bond-forming group in such a range that the substitution does not hinder the dispersibility of the above block copolymer, etc.

The ratio m/n is preferably in a range of 0.01 to 1, more preferably in a range of 0.05 to 0.5 in which "m" is the unit number of the constituent unit (1) and "n" is that of the constituent unit (2) used in the present invention. If the ratio m/n is in the above range, the percentage of the salt-forming sites formed by the amino groups possessed by the constituting unit (1) is appropriate. As a result, the adsorbability to the below-mentioned pigments becomes good, and the solubility to the above solvent due to the above constituent units (2) does not decrease, and neither the dispersibility nor the stability of the pigment drops.

Each of the unit number "m" of the above constituent unit (1) and that "n" of the above constituent unit (2) in the block copolymer used in the present invention may be an integer of 1 to 200, and is not particularly limited. The above "m" is preferably in a range of 1 to 20, and more preferably in a range of 1 to 10. Further, the above "n" is preferably in a range of 20 to 100.

Moreover, the weight average molecular weight Mw of the above block copolymer is preferably in a range of 500 to 20,000, and more preferably in a range of 1,000 to 15,000, and further preferably in a range of 3,000 to 12,000. If it is in the above range, the pigment can be uniformly dispersed.

Meanwhile, the above weight average molecular weight Mw is a value measured by a GPC (Gel Permeation Chromatography). Measurements were performed by using an HLC-8120GPC manufactured by Tosoh Corporation and two measuring columns of TSK-GEL ALPHA-M (manufactured by Tosoh Corporation) in which an elution solvent was N-methylpyrolidone added with 0.01 mol/liter of lithium bromide, a polystyrene standard for a correction curve consisted of Mw377400, 210500, 96000, 50400, 206500, 10850, 5460, 2930, 1300, 580 (Easi PS-2 series manufactured by Polymer Laboratories) and Mw1090000 (manufactured by Toso Corporation).

The bonding order of the block copolymer to be used in the present invention is not particularly limited, so long as the block copolymer has the constituent unit (1) and the constituent unit (2) wherein the below-mentioned pigment can be stably dispersed. Although not particularly limited, the above-mentioned constituting unit (1) is preferably bonded to only one end of the above block copolymer. That is, the above constituent unit (1) and the above constituent unit (2) may be bonded: in the order of the constituent unit (1)—the constituent unit (2), in the order of the constituent unit (1)—the constituent unit (2)—the constituent unit (1), or in the order of the constituent unit (2)—the constituent unit (1)—the constituent unit (2); or alternatively, the constituent units (1)—the constituent units (2) may be repeatedly bonded. In the present invention, the copolymer in which the constituent unit (1) and the constituent unit (2) are bonded in the order of the constituent unit (1)—the constituent unit (2) is preferable among them. The reason is that such a block copolymer has excellent adsorbability to the below-mentioned pigments and the pigment dispersants using such a block copolymer can be effectively prevented from agglutinating together.

<Acidic Organic Phosphorus Compound>

The acidic organic phosphorus compound, which forms the salt with an amino group possessed by the constituent unit (1) of the block copolymer that comprises the constituent unit (1) represented by the above general formula (I) and the constituent unit (2) represented by the above general formula (II), is a compound having the structure represented by the following general formula (III).

In the present invention, the use of the above acidic organic phosphorus compound can make the pigment dispersant give excellent dispersibility and stability of the below-mentioned pigment. Further, since the salt-forming sites have a high solubility to the alkaline solution at the time of the alkaline development, excellent alkaline developability can be exhibited.

(III)

In the present invention, the use of the above acidic organic phosphorus compound can make the pigment dispersant attain excellent dispersion and stability of the below-mentioned pigment. Further, since the salt-forming sites have high solubility to the aqueous alkaline solution at the time of the alkaline development, the alkaline developability can be made excellent.

In the above general formula (III), $R^5$ and $R^{5'}$ each and independently denote a hydrogen atom, a hydroxyl group, a C1 to C18 alkyl group, a C2 to C18 alkenyl group, a benzyl group, a phenyl group, a biphenyl group, —[CH($R^9$)—CH($R^{10}$)—O]$_a$—$R^{11}$, —[(CH$_2$)$_b$—O]$_c$—$R^{11}$ or —O—$R^{5''}$. When $R^5$ and $R^{5'}$ have aromatic rings, they may have appropriate substituent groups on the aromatic rings such as C1 to C4 linear or branched alkyl groups.

The above C1 to C18 alkyl group is as shown in the above $R^4$.

The above C1 to C18 alkenyl group may be linear, branched or cyclic. As such an alkenyl group, mention may be made of, for example, a vinyl group, an allyl group, a propenyl group, various butenyl groups, various hexenyl gropes, various octenyl groups, various decenyl groups, various dodecenyl groups, various tetradecenyl groups, various hexadecenyl groups, various octadecenyl groups, cyclopentenyl groups, a cyclohexenyl groups, and a cyclooctenyl group.

The above $R^{5'''}$ is a C1 to C18 alkyl group, a C2 to C18 alkenyl group, a benzyl group, a phenyl group, a biphenyl group or a monovalent group represented by —[CH($R^9$)—CH($R^{10}$)—O]$_a$—$R^{11}$ or —[(CH$_2$)$_b$—O]$_c$—$R^{11}$. The above C1 to C18 alkyl group is as shown in the above $R^4$, and the above C2 to C18 alkenyl group is as shown in the above $R^5$ and $R^{5'}$. When $R^{5'''}$ has an aromatic ring, it may have an appropriate substituent group on the aromatic ring such as a C1 to C4 linear, branched alkyl group.

The above $R^9$ and $R^{10}$ each and independently denote a hydrogen atom or a methyl group. $R^{11}$ is a hydrogen atom, a C1 to C18 alkyl group, a benzyl group, a phenyl group, a biphenyl group or a monovalent group represented by —CHO, —CH$_2$CHO, —CO—CH=CH$_2$, —CO—C(CH$_3$)=CH$_2$ or —CH$_2$COOR$^{12}$, provided that each group of $R^{11}$ may have a substituent group. $R^{12}$ is a hydrogen atom or a C1 to C5 linear, branched or cyclic alkyl group.

As a substituent group which may be possessed by the monovalent group represented by the above $R^{11}$, a linear, branched or cyclic C1 to C4 alkyl group, a halogen atom such as F, Cl, or Br can be recited, for example.

Among the $R^{11}$ groups, the C1 to C18 alkyl group is as shown in the above $R^4$. $R^{12}$ is a hydrogen atom or a C1 to C5 linear, branched or cyclic alkyl group.

In the $R^5$, $R^{5'}$ and $R^{5'''}$, "a" is an integer of 0 to 18, "b" is an integer of 1 to 5, and "c" is an integer of 0 to 18.

As the acidic organic phosphorous compound represented by the above general formula (III), compounds are preferable in which $R^5$, $R^{5'}$ and $R^{5'''}$ denote a methyl group, an isopropyl group, a n-butyl group, a 2-ethylhexyl group, a vinyl group, an allyl group, —(CH($R^9$)—CH($R^{10}$)—O)$_a$—$R^{11}$ or —((CH$_2$)$_b$—O)$_c$—$R^{11}$ and $R^{11}$, is —CO—CH=CH$_2$ or —CO—C(CH$_3$)=CH$_2$. Among them, the compounds having polymerizable groups, that is, a vinyl group, an allyl group, —(CH($R^9$)—CH($R^{10}$)—O)$_a$—$R^{11}$ or —((CH$_2$)$_b$—O)$_c$—$R^{11}$ and $R^{11}$ is —CO—CH=CH$_2$ or —CO—C(CH$_3$)=CH$_2$, are preferable. Particularly, compounds in which $R^5$, $R^{5'}$ and $R^{5'''}$ denote a vinyl group, an allyl group, a (metha) acryloyl group such as 2-methacryloyloxyethyl group, or 2-acryloyloxyethyl group are preferable.

When $R^5$, $R^{5'}$ and $R^{5'''}$ in the acidic organic phosphorus compound are a methyl group, an isopropyl group, a n-butyl group, a 2-ethylhexyl group, a vinyl group, an allyl group or —(CH($R^9$)—CH($R^{10}$)—O)$_a$—$R^{11}$ or —((CH$_2$)$_b$—O)$_c$—$R^{11}$ and $R^{11}$ is —CO—CH=CH$_2$ or —CO—C(CH$_3$)=CH$_2$, the acidic organic phosphorous compound can be made to exhibit excellent pigment dispersibility and alkaline developability. When $R^5$, $R^{5'}$ and $R^{5'''}$ denote a vinyl group, an ally group or —(CH($R^9$)—CH($R^{10}$)—O)$_a$—$R^{11}$ or —((CH$_2$)$_b$—O)$_c$—$R^{11}$ and $R^{11}$ is —CO—CH=CH$_2$ or —CO—C(CH$_3$)=CH$_2$, the acidic organic phosphorus compound contains the polymerizable group. Owing to this, when exposure is made to form a color layer by using the negative type resist composition for the color filter according to the present invention, polymerization can be easily performed between the above polymerizable groups and/or among the above polymerizable group, the alkaline-soluble resin, the polyfunctional monomer, etc. contained in the negative type resist composition for the color filter of the present invention. Thus, the above pigment dispersant can be stably present in the color layer of the color filter. Therefore, when the liquid crystal display is produced by using such a color filter, the above pigment dispersant can be prevented from bleeding out into other members such as the liquid crystal layer.

Further, when the acidic organic phosphorus compound contains polymerizable groups, the polymerizable groups possessed by the acidic organic phosphorus compound can be polymerized before the color layer is formed. As a result, since the pigment dispersant is converted to a high molecular weight state, the negative type resist composition for the color filter at non-exposed positions can have particularly excellent alkaline developability at the time of developing on the formation of the color layer.

Here, the reason why the resist composition has particularly excellent alkaline developability through the polymerization of the above polymerizable groups is considered as follows.

That is, all of the pigment dispersant added does not contribute to the improvement on the dispersibility of the below-mentioned pigment, and a part of the pigment dispersant is present free from the pigment. Further, since the pigment dispersant may generally decrease the alkaline developability, when a lot of the free pigment dispersant is present, it prevents the alkaline development on developing to form the color layer.

On the other hand, when the polymerizable groups are polymerized to attain a polymerized state before they are used to form the color layer, an amount of the free pigment dispersant can be reduced in the negative type resist composition for the color filter at the time of developing for the formation of the color layer. For this reason, the hindrance of the alkaline development with the free pigment dispersant can be reduced, and the negative type resist composition for the color filter at the non-exposed positions can have particularly excellent alkaline developability.

The content of the acidic organic phosphorus compound in the pigment dispersant (A) to be used in the present invention is not particularly limited, so long as the pigment is excellently and stably dispersed. The content is generally in a range of around 0.05 molar equivalent to 4.0 molar equivalent, preferably in a range of 0.1 molar equivalent to 2.0 molar equivalent, more preferably in a range of 0.2 molar equivalent to 1.0 molar equivalent, relative to the amino groups contained in the constituent unit (1).

<Production of Salt Type Block Copolymer>

In the present invention, a method for producing the salt type block copolymer to be used as the pigment dispersant of the component (A) is not particularly limited, so long as it can produce the pigment dispersant in which the pigment dispersant has the constituent unit (1) and the constituent unit (2), and the amino groups possessed by the constituent unit (1) and the acidic organic phosphorus compound represented by the above general formula (III) form a salt. In the present invention, the pigment dispersant can be produced, for example, by a method wherein, after the above constituent units (1) and (2) are polymerized by using a publicly known polymerization method, the resultant is dissolved or dispersed in a solvent mentioned later, and then the above acidic organic phosphorus compound is added into the solvent, followed by stirring.

The polymerization method is not particularly limited, so long as the above constituent units (1) and (2) can be polymerized at a desired unit ratio and a desired molecular weight can be realized. A method generally used in polymerizing a compound comprising a vinyl group can be used. For example, an anionic polymerization, and a living radical polymerization can be used. Among them, it is preferable in the present invention to use a method disclosed in J. Am. Chem. Soc., 105, 5706 (1983) in which polymerization proceeds in a living fashion like a group transfer polymerization (GTP). Since the molecular weight, the molecular weight distribution, etc. can be easily set in desired ranges by this method, characteristics such as the dispersibility and the alkaline developability of the pigment dispersant can be made uniform.

In the negative type resist composition for the color filter according to the present invention, as the pigment dispersant being the component (A), one kind of the above salt type block copolymers may be used, or two or more kinds thereof may be used in combination. The content of the pigment dispersant is appropriately selected depending upon factors such as the kind of the pigment used, and the concentration of the solid component in the negative type resist composition. It is ordinarily in a range of 5 parts by weight to 200 parts by weight, preferably in a range of 10 parts by weight to 100 parts by weight, and more preferably in a range of 20 parts by weight to 80 parts by weight relative to 100 parts by weight of the below-mentioned pigment (B). If the content of the salt type block copolymer is within the above range, the pigment can be uniformly dispersed, and the color layer having a sufficient hardness can be formed without a relatively compounding ratio between the alkaline-soluble resin and the polyfunctional monomer being reduced.

((B) Pigment)

In the negative type resist composition for the color filter according to the present invention, the pigment to be used as the component (B) is not particularly limited, so long as it can develop a desired color in the state that the color layer of the color filter is formed. One of various organic or inorganic coloring agents can be used alone or two or more kinds of them can be used in a mixed state.

<Kinds of Pigments>

As the above organic coloring agents, dies, organic pigments, and natural coloring matters can be used for example. As concrete examples of the organic pigments, compounds classified into Pigments in Color Index (C.I., published by The Society of Dyers and Colourists) can be recited.

As such compounds, recitation can be made of, for example, pigments given with Color Index (C. I.) numbers including: yellow series pigments such as C.I. Pigment Yellow 1, C.I. Pigment Yellow 3, C.I. Pigment Yellow 12, C.I. Pigment Yellow 138, C.I. Pigment Yellow 139, C.I. Pigment Yellow 150, C.I. Pigment Yellow 180, and C.I. Pigment Yellow 185; red series pigments such as C.I. Pigment Red 1, C.I. Pigment Red 2, C.I. Pigment Red 3, C.I. Pigment Red 242, C.I. Pigment Red 254, and C.I. Pigment Red 177; blue series pigments such as C.I. Pigment Blue 15, C.I. Pigment Blue 15:3, C.I. Pigment Blue 15:4, and C.I. Pigment Blue 15:6; violet series pigments such as C.I. Pigment Violet 23; green series pigments such as Pigment Green 36, and C.I. Pigment Green 58.

Meanwhile, as the inorganic coloring agents, recitation can be made of, for example, inorganic pigments and body pigments. As concrete examples, recitation can be made of titanium oxide, silica, barium sulfate, calcium carbonate, zinc flower, lead sulfate, chrome yellow, zinc yellow, colcothar (red oxide of iron (III)), cadmium red, ultramarine blue, iron blue, chromic oxide green, cobalt green, umber, titanium black, synthetic iron black, and carbon black.

<Particle Diameters of Pigments>

The average particle diameter of the pigment to be used in the present invention is not particularly limited, so long as it can develop a desired color when it is used in the color layer for the color filter. Depending upon the kinds of the pigments, the average particle diameter is preferably in a range of 10 nm to 100 nm, and more preferably in a range of 10 nm to 50 nm. When the average particle diameter of the pigment is in the above range, it is possible to attain a high contrast and a high quality in the liquid crystal display produced by using the negative type resist composition for the color filter according to the present invention. Meanwhile, regarding the conventional pigment dispersants, there are problem in that as the particle diameters of the pigment becomes minuter, a larger amount of the pigment dispersant is necessary, so the alkaline developability may deteriorate or the residue may increase. On the other hand, since the pigment dispersant to be used in the negative type resist composition for the color filter according to the present invention has excellent alkaline developability, such problems could not occur. Therefore, as shown by the above ranges, as the average particle diameter of the pigment becomes finer as compared with the conventional pigments, the features possessed by the negative type resist composition for the color filter of the present invention can be more exhibited.

In addition, the average particle diameter of the above pigment can be determined by a method in which sizes of primary particles are directly measured from an electron microscope photograph. More specifically, minor axis diameters and major axis diameters of discrete primary particles were measured, and the average value thereof was taken as the particle diameter. Next, regarding 100 or more particles, respective particle volumes (weights) were determined as being approximated to rectangular parallelepiped bodies of the measured particle diameters, and the volume average particle diameter was determined as the average particle diameter. The same results can be obtained by using an electron microscope of either a transmission type (TEM) or a scanning type (SEM).

The content of the pigment to be used as the component (B) in the negative type resist composition for the color filter of the present invention is not particularly limited, so long as a desired color can be developed when a color layer of the color filter is formed. Although different depending upon the kind of the pigment used, the content is preferably in a range of 20 mass % to 100 mass %, and more preferably in a range of 30 mass % to 80 mass % relative to the solid component other than the pigment in the negative type resist composition for the color filter. If the content of the pigment is in the above range, the negative type resist composition for the color filter can be obtained, which can form a color layer capable of developing a desired color. In addition, the pigment can be uniformly dispersed in the negative type resist composition for the color filter.

Note that the above solid component is all except for the above-mentioned solvent, and contains the multifunctional monomer, etc. dissolved in the solvent.

(Alkaline-Soluble Resin (C))

As the alkaline-soluble resin to be used as the component (C) in the negative type resist composition for the color filter according to the present invention, those generally employed in the negative type resist can be used. The alkaline-soluble resin is not particularly limited, so long as it is soluble in the aqueous alkaline solution. For example, mention may be made of, copolymers between: one or more kinds selected from methyl(metha)acrylate, ethyl(metha) acrylate, n-propyl (metha)acrylate, isopropyl(metha)acrylate, n-butyl(metha) acrylate, sec.-butyl(metha)acrylate, isobutyl(metha)acrylate, tert.-butyl(metha)acrylate, n-pentyl(metha)acrylate, n-hexyl (metha)acrylate, 2-ethylhexyl(metha)acrylate, n-octyl (metha)acrylate, n-decyl(metha)acrylate, benzyl(metha) acrylate, styrene, γ-methylstyrene, N-vinyl-2-pyloridone, and glycidyl (metha)acrylate; and one or more kinds selected from (metha)acrylic acid, a dimer of acrylic acid (M-5600 manufactured by Toagosei Co., Ltd., for example), itaconic acid, crotonic acid, maleic acid, fumaric acid, vinyl acetate, anhydrides thereof. Furthermore, polymers in which an ethylenic unsaturated compound having a glycidyl group or a hydroxyl group is added to the above copolymer can be recited by way of example. However, the alkaline-soluble resin is not limited to the above ones.

Among them, when the polymers, etc. comes to have the ethylenic unsaturated bonds, for example by adding the ethylenic unsaturated compound having a glycidyl group or a hydroxyl group to the above copolymer, they can be polymerized with a polyfunctional monomer as mentioned later. Such a polymer is particularly favorable from the standpoint that the color layer is more stabilized.

One kind of the alkaline-soluble resins to be used as the component (C) in the negative type resist composition for the color filter of the present invention may be used or two or more kinds thereof may be used in combination. The content thereof is ordinarily in a range of 10 parts by mass to 1000 parts by mass and preferably in a range of 20 parts by mass to 500 parts by mass relative to 100 parts by mass of the pigment contained in the negative type resist composition for the color filter. If the content of the alkaline-soluble resin is too small, a sufficient alkaline developability may not be obtained, whereas if the content of the alkaline-soluble resin is too large, the rate of the pigment so decreases that a sufficient concentration of the color may not be obtained.

((D) Polyfunctional Monomer)

The polyfunctional monomer to be used as the component (D) in the negative type resist composition for the color filter according to the present invention is not particularly limited so long as it can be polymerized with a photo initiator as mentioned later. A compound having two or more ethylenic unsaturated double bonds is used, and polyfunctional (metha) acrylates having two or more acryloyl groups or methacryloyl groups are particularly preferred.

As such polyfunctional (metha)acrylate, mention may be made of, for example, difunctional (metha)acrylates such as ethylene glycol di(metha)acrylate, diethylene glycol di(metha)acrylate, hexanediol di(metha)acrylate, a long-chain fatty acid di(metha)acrylate, neopentyl glycol di(metha)acrylate, hydroxypivalic acid neopentyl glycol di(metha)acrylate, stearic acid-modified pentaerythritol di(metha)acrylate, propylene glycol di(metha)acrylate, glycerol di(metha)acrylate, triethylene glycol di(metha)acrylate, tetraethylene glycol di(metha)acrylate, tetramethylene glycol di(metha)acrylate, butylene glycol di(metha)acrylate, dicyclopentanyl di(metha)acrylate, polyethylene glycol di(metha)acrylate, polypropylene di(metha)acrylate, triglycerol di(metha)acrylate, neopentyl glycol-modified trimethylol propane di(metha)acrylate, allylated cyclohexyl di(metha)acrylate, methoxylated cyclohexyl di(metha)acrylate, acrylated isocyanurate, bis(acryloxyneopentyl glycol) adipate, bisphenol A di(metha)acrylate, tetrabromo bisphenol A di(metha)acrylate, bisphenol S di(metha)acrylate, butanediol di(metha)acrylate, phthalic acid di(metha)acrylate, phosphoric acid (metha)acrylate, and zinc(metha)acrylate.

Further, as polyfunctional (metha)acrylates having three or more functional groups, mention may be made of, for example, trimethylolpropane tri(metha)acrylate, trimethylolethane tri(metha)acrylate, glycerol tri(metha)acrylate, pentaerythritol tri(metha)acrylate, pentaerythritol tetra(metha)acrylate, alkyl-modified pentaerythritol tri(metha)acrylate, succinic anhydride-modified pentaerythritol tetra(metha)acrylate, phosphoric acid tri(metha)acrylate, tris(acryloxyethyl)isocyanurate, tris(methacryloxyethyl)isocyanurate, dipentaerythritol tetra(metha)acrylate, ditrimethylol propane tetraacrylate, alkyl-modified dipentaerythritol tetra(metha) acrylate, dipentaerythritol hexa(metha)acrylate, dipentaerythritol penta(metha)acrylate, alkyl-modified dipentaerythritol penta(metha)acrylate, succinic anhydride-modified dipentaerythritol penta(meta)acrylate, urethane tri (metha)acrylate, ester tri(metha)acrylate, urethane hexa (metha)acrylate, and ester hexa(metha)acrylate.

One kind of these polyfunctional (metha)acrylates may be used alone, or two or more kinds thereof may be used in combination. Further, when the negative type resist composition for the color filter of the present invention is required to have excellent photo curability (high sensitivity), it is preferable that the polyfunctional monomer has three (trifunctional) or more polymerizable double bonds. For example, dipentaerythritol penta(metha) acrylate and dipentaerythritol hexa(metha) acrylate are favorably used.

The content of the above polyfunctional monomer to be used as the component (D) in the negative type resist composition for the color filter of the present invention is not particularly limited. The content is ordinarily around 5 parts by mass to 500 parts by mass, preferably in a range of 20 parts by mass to 300 parts by mass relative to 100 parts by mass of the alkaline-soluble resin being the component (C). If the content of the polyfunctional monomer is smaller than the above range, it can be that the photo curing does not sufficiently proceed and the exposed portions are dissolved out. On the other hand, if the content of the polyfunctional monomer is larger than the above range, the alkaline developability may be degraded.

((E) Photo Initiator)

The photo initiator to be used as the component (E) in the negative type resist composition for the color filter of the present invention is not particularly limited, and an appropriate one can be selectively used from various photo initiators conventionally known. For example, mention can be made of: aromatic ketones such as benzophenone, Michler's ketone, 4,4'-bisdiethyl aminobenzophenone, 4-methoxy-4'-dimethylaminobenzophenone, 2-ethylanthraquinone, and phenanthrene; benzoins ethers such as benzoin methyl ether, benzoin ethyl ether, and benzoin phenyl ether; benzoins such as methyl benzoin, and ethyl benzoin: 2-(o-chlorophenyl)-4,5-phenyl imidazol dimer, 2-(o-chlorophenyl)-4,5-di(m-methoxyphenyl)imidazol dimer, 2-(o-fluorophenyl)-4,5-diphenylimidazol dimer, 2-(o-methoxyphenyl)-4,5-diphenyl imidazol dimer, 2,4,5-triaryl imidazol dimer, 2-(o-chlorophenyl)-4,5-di(m-methylphenyl)imidazol dimer, 2-benzyl-2-dimethylamino-1-(4-morpholino phenyl)-butanone; halomethyloxadiazol compounds such as 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole; halomethyl-5-triazine based compounds such as 2,4-bis(trichloromethyl)-6-p-methoxystyryl-5-triazine, 2,4-bis(trichloromethyl)-6-(1-p-dimethylaminophenyl-1,3-butadienyl)-S-triazine, 2-trichloromethyl-4-amino-6-p-methoxystyryl-5-triazine, 2-(naphtho-1-yl)-4,6-bis-trichloromethyl-5-triazine, 2-(4-ethoxy-naphtho-1-yl)-4,6-bis-trichloromethyl-5-triazine, 2-(4-butoxy-naphtho-1-yl)-4, and 6-bis-trichloromethyl-5-triazine; 2,2-dimethoxy-1,2-diphenylethane-1-one, 2-methyl-1-[4-(methylthio)phenyl]-2-morpholinopropane-1-one, 1,2-benzyl-2-dimethylamino-1-(4-morpholinophenyl)-butane-1,1-hydroxy-cyclohexyl-phenyl ketone, benzyl, benzoylbenzoic acid, methyl benzoylbenzoate, 4-benzoyl-4'-methyldiphenyl sulfide, benzylmethyl ketal, dimethylamino benzoate, p-dimethylamino benzoic acid isoamyl, 2-n-butoxyethyl-4-dimethylamino benzoate, 2-chlorothioxanthone, 2,4-diethylthioxanthone, 2,4-dimethylthioxanthone, isopropylthioxanthone, ethanone, 1-[9-ethyl-6-(2-methylbenzoyl)-9H-carbazole-3-yl]-1-(o-acetyl oxime), 4-benzoyl-methyldiphenyl sulfide, 1-hydroxy-cyclohexyl-phenyl ketone, 2-benzyl-2-(dimethylamino)-1-[4-(4-morpholinyl)phenyl]-1-butanone, 2-(dimethylamino)-2-[(4-methylphenyl)methyl]-1-[4-(4-morpholinyl)phenyl]-1-butanone, α-dimethoxy-α-phenyl acetophenone, phenylbis(2,4,6-trimethylbenzoyl)phosphine oxide, and 2-methyl-1-[4-(methylthio)phenyl]-2-(4-morpholinyl)-1-propanone. One kind of these photo initiators may be used alone, or two or more kinds thereof may be used in combination.

The content of the photo initiator to be used as the component (E) in the negative type resist composition for the color filter of the present invention is ordinarily around 0.01 part by mass to 100 parts by mass and preferably in a range of 5 parts by mass to 60 parts by mass relative to 100 parts by mass of the polyfunctional monomer as the component (D). If this content is smaller than the above range, the polymerization reaction cannot be sufficiently carried out, so that the hardness of the color layer may not be sufficiently ensured. On the other hand, if the content is larger than the above range, the content of the pigment, etc. in the solid component of the negative type resist composition for the color filter becomes relatively smaller, so that a sufficient concentration of the color may not be obtained.

((F) Solvent)

The solvent to be used as the component (F) in the negative type resist composition for the color filter of the present invention is not particularly limited, so long as it is an organic solvent which does not react with each of the components in the resist composition and it can dissolve or disperse them. More specifically, mention may be made of organic solvents including: alcohols such as methyl alcohol, ethyl alcohol, N-propyl alcohol, and isopropyl alcohol; ether alcohols such as methoxy alcohol, ethoxy alcohol, methoxyethoxy ethanol, and ethoxyethoxy ethanol; esters such as ethyl acetate, butyl acetate, 3-methoxybutyl acetate, methyl methoxy propionate, ethyl ethoxy propionate, and ethyl lactate; ketones such as acetone, methylisobutyl ketone, and cyclohexanone; ether alcohol acetates such as methoxyethyl acetate, methoxypropyl acetate, methoxydibutyl acetate, ethoxyethyl acetate, ethyl cellosolve acetate, methoxyethoxyethyl acetate, and ethoxyethoxyethyl acetate; ethers such as diethyl ether, ethylene glycol dimethyl ether, diethylene glycol dimethyl ether, and tetrahydrofuran; non-proton type amides such as N,N-diethyl formamide, N, N-dimethyl acetoamide, and N-methyl-pyrrolidone; lactones such as γ-butyro lactone; unsaturated hydrocarbons such as benzene, toluene, xylene, naphthalene; and saturated hydrocarbons such as n-hepthane, n-hexane, and n-octane.

Among them, use can be preferably made of: ether alcohol acetates such as methoxyethyl acetate, ethoxyethyl acetate, ethylcelosolve acetate, methoxyethoxyethyl acetate, and ethoxyethoxyethyl acetate; ethers such as ethylene glycol dimethyl ether, diethylene glycol dimethyl ether, and propylene glycol diethyl ether; and esters such as 3-methoxybutyl acetate, methyl methoxypropinonate, ethyl ethoxypropionate, and ethyl lactate.

Particularly, as the solvent to be used in the present invention, MBA (3-methoxybutyl acetate), PGMEA (propylene glycol monomethyl ether acetate), DMDG (diethylene glycol dimethyl ether), diethylene glycol methylethyl ether, PGME (propylene glycol monomethyl ether) or a mixture thereof is preferable from the standpoint of dissolvability and coating competence as the pigment dispersant.

The content of the solvent as the component (F) in the negative type resist composition for the color filter of the present invention is not particularly limited, so long as it can uniformly dissolve or disperse each of the components of the negative type resist composition. In the present invention, the components excluding the solvent in the negative type resist composition are preferably in a range of 5 mass % to 40 mass % and more preferably in a range of 10 mass % to 30 mass %. When they are in the above range, the viscosity suitable for coating can be attained.

(Arbitrary Addition Components)

In the negative type resist composition for the color filter according to the present invention, various additives such as a polymerization terminator, a chain transfer agent, a leveling agent, a plasticizer, a surface active agent, a defoaming agent, a silane coupling agent, an ultraviolet ray absorbing agent, and an adhesion promotor are used, if necessary, within such a range as not damaging the object of the present invention.

As the surface active agent to be used among them, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitane fatty acid esters, fatty acid-modified polyesters, and tertiary amine-modified polyurethanes. Further, besides the above, fluorine-based surface active agents can be used.

In addition, as the plasticizer, dibutyl phthalate, dioctyl phthalate, and tricresyl are recited, for example. As the defoaming agent and the leveling agent, silicon-based, fluorine-based and acrylic compounds are recited, for example.

(Preparation of the Negative Type Resist Composition for the Color Film)

The method for preparing the negative type resist composition for the color film according to the present invention is not particularly limited, so long as it can homogeneously dissolve or disperse (A) the pigment dispersant, (B) the pigment, (C) the alkaline-soluble resin, (D) the polyfunctional monomer, (E) the photo initiator, and various additives to be used if desired into (F) the solvent. The resist composition can be prepared by mixing them with use of a publicly known mixing measure.

As the method for preparing the negative type resist composition, recitation may be made of, for example, (1) a method in which after a pigment dispersed liquid is prepared with a disperser by adding the above pigment dispersant and the pigment into the solvent, the alkaline-soluble resin, the polyfunctional monomer, the photo initiator, and various additives to be used if desired are added and mixed into the pigment dispersed liquid; (2) a method in which the above pigment dispersant, the pigment, the alkaline-soluble resin, the polyfunctional monomer, the photo initiator, and various additives to be used if desired are simultaneously fed and mixed into the solvent; and (3) a method in which after the above pigment dispersion, the alkaline-soluble resin, the polyfunctional monomer, the photo initiator, and various additives to be used if desired are added and mixed into the solvent, the pigment is added and mixed thereinto.

Among these methods, the method (1) is preferable from the standpoint that the pigment can be uniformly dispersed, while its agglomeration is effectively prevented. In this case, the content of the solvent in the pigment dispersion is preferably in a range of 60 mass % to 90 mass %, from the standpoint such as of the dispersability of the pigment, the stability of the pigment with the lapse of time, and the chromaticity of the obtained color filter.

As a disperser to disperse the pigment in the preparation of the pigment dispersion liquid in the above method (1), recitation can be made of: roll mills of such as a two-roll type or a three-roll type; ball mills such as a ball mill or a vibration ball mill; bead mills such as a paint shaker, a continuous disc type bead mill, or a continuous annular type bead mill. A preferable dispersing condition in case of the bead mill is that diameters of beads used are preferably in a range of 0.03 mm to 2 mm and more preferably in a range of 0.1 mm to 1 mm. Further, it is preferable that the mixture is filtered with a membrane filter of around 5.0 µm to 0.2 µm after dispersing. Under these conditions, a pigment dispersion liquid having excellent pigment dispersibility can be obtained.

Furthermore, when the acidic organic phosphorus compound contained in the pigment dispersant to be used in the present invention has a polymerizable group, the above pigment dispersant may be polymerized together by irradiating light, for instance, after the pigment dispersant and the photo initiator are added into the solvent or after the pigment dispersant, the pigment and the photo initiator are dispersed or dissolved into the solvent. When the pigment dispersant is polymerized together in this manner, the dispersion stability of the pigment in the negative type resist composition for the color filter according to the present invention can be enhanced.

Next, the color filter according to the present invention will be explained.

[Color Filter]

The color filter according to the present invention is characterized by comprising a color layer formed by using the above-mentioned negative type resist composition for the color filter of the present invention.

Such a color filter of the present invention will be explained with reference to the drawing. FIG. 1 is a schematically sectional view showing one embodiment of the color filter of the present invention. According to FIG. 1, the color filter 10 of the present invention comprises a transparent substrate 1, a light-shielding portion 2 and a color layer 3.

Since the color layer is formed by using the above-mentioned negative type resist composition for the color filter according to the present invention and thus the alkaline developability is excellent, the color filter of the present invention has high productivity. In addition, since the alkaline-developability is excellent, the color filter is of a high quality with less residue of the negative type resist composition for the color filter at non-exposed positions.

(Color Layer)

The color layer to be used in the color filter of the present invention is not particularly limited, so long as it is formed by using the above-mentioned negative type resist composition for the color filter according to the present invention. The color layer is ordinarily formed at openings of the light-shielding portion on a transparent substrate mentioned later, and is constituted by a color pattern of three or more colors, depending on the kinds of the pigments contained in the negative type resist compositions for the color filter.

Meanwhile, the alignment of the color layer is not particularly limited, and it can take a general alignment of such as a stripe type, a mosaic type, a triangle type, or a four-pixel array type. Further, the width, the area, etc. of the color layer can be arbitrarily set.

The thickness of the color layer can be appropriately controlled by adjusting a coating method, the concentration of the solid component, the viscosity, etc. of the negative type resist composition for the color filter. Ordinarily, the thickness is preferably in a range of 1 µm to 5 µm.

The color layer can be formed by the following method, for example.

First, a wet coated film is formed by coating the above-mentioned negative type resist composition for the color filter of the present invention to the transparent substrate mentioned later by using a coating method such as a spray coating method, a dip coating method, a bar coating method, a koal coat (transliteration) method, or a spin coating method.

Next, after the wet coated film is dried by using a hot plate or an oven, the alkaline-soluble resin, the polyfunctional monomer, etc. are subjected to a photopolymerization reaction by exposing the film through a mask with a given pattern, thereby obtaining a coated film of the negative type resist composition for the color filter. As a light source to be used for the exposure, an ultraviolet lamp such as a low-pressure mercury lamp, a high-pressure mercury lamp, a metal halide lamp, and an electron beam lamp are recited, for example. The exposure intensity is appropriately adjusted depending upon factors such as the used light source, and the thickness of the coated film.

Meanwhile, heating may be performed to promote the polymerization reaction after the exposure. The heating condition is appropriately selected, depending on factors such as the compounding ratio of the respective components in the used negative type resist composition for the color filter and the thickness of the coated film.

Next, the coated film is formed in a desired pattern by developing the resultant with a developing liquid and dissolving and removing the non-exposed portions. As the developing liquid, a solution in which an alkali is dissolved into water or an aqueous solvent is ordinarily used. Appropriate amounts of a surface active agent, etc. may be added to this alkaline solution. Further, an ordinarily method can be employed as the developing method.

After the developing treatment, a color layer is ordinarily formed by washing off the developing liquid and drying a cured coated film of the negative type resist composition. At that time, heating may be performed, after the developing treatment, so as to fully cure the coated film. The heating condition is not particularly limited, and is appropriately selected, depending upon the use of the coated film.

(Light-Shielding Portion)

The light-shielding portion in the color filter of the present invention is formed in a pattern shape on the transparent substrate mentioned later, and can be identical with that to be used as a light-shielding portion in an ordinary color filter.

The pattern shape of the light-shielding portion is not particularly limited, and a shape such as a strive shape, and a matrix shape is recited. As such a light-shielding portion, one in which a black pigment is dispersed or dissolved in a binder-resin, metallic thin films of such as chromium, and chromium oxide are recited, for example. Such a metallic thin film may be a film in which a $CrO_x$ (x: arbitrary number) and a Cr film are laminated in two layers. In addition, it may be a film in which a $CrO_x$ (x: arbitrary number) having a further reduced reflectance, a $CrN_y$ film (y: arbitrary number) and a Cr film are laminated in three layers.

When the light-shielding portion is one in which a black coloring agent is dispersed or dissolved in a binder resin, a method for forming this light-shielding portion is not particularly limited, so long as it can pattern the light-shielding portion. For example, a photolithography method, a printing method, and an ink jet method using a light-sensitive resin composition for the light-shielding portion can be recited.

When the printing method or the ink jet method is used as the method for forming the light-shielding portion in the above-mentioned case, as the binder resin, a polymethyl methacrylate resin, a polyacrylate resin, a polycarbonate resin, a polyvinyl alcohol resin, a polyvinyl pyrrolidone resin, a hydroxyethyl cellulose resin, a carboxymethyl cellulose resin, a polyvinyl chloride resin, a melamine resin, a phenol resin, an alkyd resin, an epoxy resin, a polyurethane resin, a polyester resin, a maleic acid resin, and a polyamide resin are recited, for example.

When the photolithography method is used as the method for forming the light-shielding portion in the above-mentioned case, as the binder resin, light-sensitive resins having reactive vinyl groups, such as an acrylate-based resin, a methacrylate-based resin, a polyvinyl cinnamate-based resin, and a cyclic rubber-based resin are used, for example. In this case, a photo polymerization initiator may be added to the light-sensitive resin composition for the light-shielding portion which contains the black coloring agent and the light-sensitive resin. Furthermore, if necessary, a sensitizer, a coating-improving agent, a development-improving agent, a crosslinking agent, a polymerization inhibitor, a plasticizer, a flame retardant, etc. may be added. In the present invention, the above-mentioned negative type resist composition for the color film which has a black pigment such as a carbon black, or a titanium black as a pigment may be used as the light-sensitive resin composition for the above light-shielding portion.

On the other hand, when the light-shielding portion is a metallic thin film, the method for forming this light-shielding portion is not particularly limited, so long as it can pattern the light-shielding portion. For instance, the photolithography method, a vapor deposition method using a mask, and a printing method can be recited.

The thickness of the light-shielding portion is set at around 0.2 μm to 0.4 μm in the case of the metallic thin film, and at around 0.5 μm to 2 μm in the case that the black coloring agent is dispersed or dissolved in the binder resin.

(Transparent Substrate)

The transparent substrate in the color filter according to the present invention is not particularly limited, so long as it is a transparent substrate for the visual light. Transparent substrates to be used for ordinary color filters can be used. More specifically, non-flexible transparent rigid materials such as a fused quartz, a non-alkaline glass, and a synthetic quartz plate, or transparent flexible materials having flexibility such as a transparent resin film, and an optical resin plate are recited.

The thickness of the transparent substrate is not particularly limited, but the transparent substrate having the thickness of, for example, around 100 μm to 1 mm can be used, depending on the use of the color film of the present invention.

Meanwhile, in the color filter of the present invention, an overcoat layer and a transparent electrode layer and further an alignment layer, and a columnar spacer may be formed beside the above transparent substrate, the light-shielding portion and the color layer.

Next, the liquid crystal display according to the present invention will be explained.

[Liquid Crystal Display]

The liquid crystal display of the present invention is characterized by having the above-mentioned color filter of the present invention.

Figure 2:
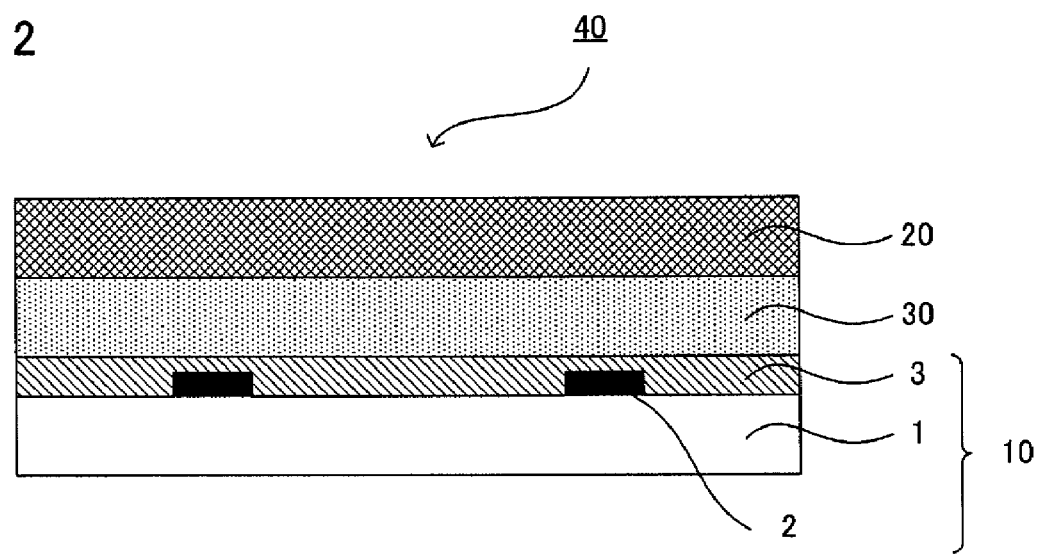
FIG. 2 is a schematic view illustrating one embodiment of the liquid crystal display according to the present invention.

Such a liquid crystal display of the present invention will be explained with reference to the drawing. FIG. 2 is a schematic view showing one embodiment of the liquid crystal display of the present invention. As illustrated in FIG. 2 as an example, the liquid crystal display 40 of the present invention comprises a color filter 10, a counter substrate 20 having a TFT array substrate or the like, and a liquid crystal layer 30 formed between the color filter 10 and the counter substrate 20.

The liquid crystal display of the present invention is not limited to the construction shown in this FIG. 2, and it can be generally made in a publicly known construction using a color filter.

A driving system for the liquid crystal display of the present invention is not particularly limited, but a driving system generally used in the liquid crystal display can be employed. As such a driving system, a TN system, an IPS system, an OCB system, an MVA system, etc. can be recited. In the present invention, any of these systems can be favorably used.

Furthermore, the counter substrate can be appropriately selectively used, depending on factors such as the driving system of the liquid crystal display of the present invention.

In addition, as a liquid crystal constituting the liquid crystal layer, various liquid crystals having different dielectric anisotropies and mixtures thereof can be used, depending on factors such as the driving system of the liquid crystal display of the present invention.

As a method for forming the liquid crystal layer, a method to be ordinarily used as a method for preparing a liquid crystal cell can be used. For example, a vacuum injecting system, and a liquid crystal dropwise injecting system are recited.

In the case of the vacuum feeding system, for example, a liquid crystal cell is preliminarily prepared by using a color filter and opposed counter substrate, a liquid crystal is converted to an isotropic liquid by heating, the liquid crystal is injected into a liquid crystal cell in an isotropic liquid state by utilizing a capillary effect, and a liquid crystal layer is formed by sealing it with an adhesive. Thereafter, the sealed liquid crystal can be aligned by slowly cooling the liquid crystal cell to an ordinary temperature.

In the liquid-crystal dropwise feeding system, for example, a sealing agent is applied onto a peripheral edge of a color filter, the color filter is heated to such a temperature as to make a liquid crystal to be an isotropic phase, the liquid crystal is dropwise fed in an isotropic liquid state by using a dispenser or the like, the color filter and a counter substrate are laminated together under a reduced pressure, a liquid crystal layer can be formed by bonding them via the sealing agent. Thereafter, the sealed liquid crystal can be aligned by slowly cooling the liquid crystal cell to an ordinary temperature.

EXAMPLES

Next, the present invention will be explained in more detail based on. Examples, but the invention is not limited to these Examples at all.

1. Production of a Block Copolymer A

Tetrahydrofuran (THF), 250 parts by weight and 5.81 parts by weight of dimethylketene methyl trimethylsilyl acetal as an initiator were added to a 500 ml round-bottom/four-mouth separable flask which is equipped with a cooling tube, an addition funnel, a nitrogen inlet, a mechanical stirrer and a digital thermometer, through the addition funnel, followed by a sufficient nitrogen replacement. A 1M acetonitrile solution of tetrabutyl ammonium m-chlorobenzoate, 0.5 part by weight, as a catalyst was injected by using a syringe, and 100 parts by weight of methyl methacrylate as a first monomer was added dropwise in 60 minutes by using the addition funnel. The temperature was kept at less than 40° C. by cooling the reaction flask with an ice bath. One hour later, 33.3 parts by weight of dimethylaminoethyl methacrylate as a second monomer was added dropwise in 20 minutes. After the mixture was reacted for 1 hour, the reaction was stopped by adding 1 part by weight of methanol. The resulting block copolymer in the THF solution was precipitated again in hexane, which was purified by filtration and vacuum drying, thereby obtaining a block copolymer A. Confirmation of the thus obtained block copolymer A by means of a GPC (gel permeation chromatography) with N-methylpyrrolidone, 0.01M lithium bromide added/polystyrene standard revealed that a constituting ratio MMA/DMAEMA between methyl methacrylate (MMA) and dimethylaminoethyl methacrylate (DMAEMA) was 3/1, the weight average molecular weight $M_w$ was 4500, the average molecular weight $M_n$ was 5330, and the multiple dispersion degree was 1.18.

the following Table 1, and salt-type block copolymer solutions B to G in which a phosphate salt was formed at a solid component of 20 mass %, salt-type block copolymer solutions H to K in which a quaternary ammonium salt was formed, and a block copolymer solution L in which no salt was formed were obtained.

In the above, the salt-forming component was added to be an equimolar amount to that of the DMAEMA unit of the block copolymer.

TABLE 1

| Block copolymer solution | Block copolymer | Salt-forming component | Compounding amount (parts by weight) | | | Reaction Temperature (° C.) |
|---|---|---|---|---|---|---|
| | | | Block Copolymer | Salt-forming component | Solvent (PGMEA) | |
| Salt-type block copolymer solution A | Block copolymer A | Methacryloxyethyl acid phosphate | 5.0 | 1.17 | 24.68 | 25 |
| Salt-type block copolymer solution B | Block copolymer A | Dimethacrloyloxyethyl acid phosphate | 5.0 | 1.47 | 25.88 | 25 |
| Salt-type block copolymer solution C | Block copolymer A | Monobutyl acid phosphate | 5.0 | 0.86 | 23.44 | 40 |
| Salt-type block copolymer solution D | Block copolymer A | Dibutyl acid phosphate | 5.0 | 1.17 | 24.68 | 40 |
| Salt-type block copolymer solution E | Block copolymer A | Vinyl phosphonic acid | 5.0 | 0.58 | 22.32 | 40 |
| Salt-type block copolymer solution F | Block copolymer A | Phenyl phosphinic acid | 5.0 | 0.79 | 23.16 | 40 |
| Salt-type block copolymer solution G | Block copolymer B | Methacryloxyethyl acid phosphate | 5.0 | 0.53 | 22.12 | 25 |
| Salt-type block copolymer solution H | Block copolymer A | Benzyl chloride | 5.0 | 0.72 | 22.89 | 80 |
| Salt-type block copolymer solution I | Block copolymer A | Allyl chloride | 5.0 | 0.44 | 21.76 | 80 |
| Salt-type block copolymer solution J | Block copolymer A | Allyl bromide | 5.0 | 0.69 | 22.76 | 25 |
| Salt-type block copolymer solution K | Block copolymer A | 4-chloromethyl styrene | 5.0 | 0.86 | 23.44 | 80 |
| Block copolymer solution L | Block copolymer A | — | 5.0 | 0 | 20 | — |

2. Production of a Block Copolymer B

A block copolymer B was obtained by the same method as in the case of the above block copolymer A, except that dimethylketene methyl trimethylsilyl acetal was 2.32 parts by weight, the 1M acetonitrile solution of tetrabutyl ammonium m-chlorobenzoate was 0.2 part by weight, methyl methacrylate was 120 parts by weight, dimethylaminoethyl methacrylate was 13.3 parts by weight and methanol was 0.5 part by weight. Confirmation of the thus obtained block copolymer B by the same method as in the case of the block copolymer A revealed that the constituting ratio MMA/DMAEMA between MMA and DMAEMA was 9/1, the weight average molecular weight $M_w$ was 9940, the average molecular weight $M_n$ was 11800, and the multiple dispersion degree was 1.19.

3. Preparation of a Salt Type Block Copolymer Solution

The block copolymer A, 5.0 parts by weight, was dissolved into 24.68 parts by weight of propylene glycol monomethyl ether acetate (PGMEA) in a 100 ml round-bottom flask, 1.17 parts by weight (an equimolar amount to that of the DMAEMA unit of the block copolymer) of methacryloxyethyl acid phosphate (Phosmer M: Unichemical Co., Ltd.) as a salt-forming component was added thereto, and the mixture was stirred at a reaction temperature of 25° C. for 6 hours, thereby obtaining a salt-type block copolymer solution A in which a phosphate salt was formed at a solid component of 20 mass %.

Similarly, the block copolymer, the salt-forming component and the reaction temperature were changed as shown in 4. Preparation of a Pigment-Dispersed Liquid Next, 12 parts by weight of the prepared salt-type block copolymer solution (block copolymer solutions A to L), 15 parts by weight of PGMEA, 3 parts by weight of a diketopyrrolopyrrole pigment (a) (PR254: the average particle diameter 30 nm) and 60 parts by weight of 0.3 mm zirconia beads were charged into a mayonnaise bottle, which was shaken as preliminary cracking by a paint shaker (manufactured by Asada Tekko Co., Ltd. (transliteration)) for 1 hour. Then, 30 parts by weight of the dispersion liquid and 60 parts by weight of 0.1 mm-particle diameter zirconia beads were charged into a mayonnaise bottle, which was similarly subjected to dispersion with the paint shaker for 3 hours as a primary cracking, thereby obtaining pigment dispersions A to L.

Example 1

Into 46 parts by weight of the pigment dispersion liquid A obtained above were added 31 parts by weight of a binder component (9 parts by weight of an acryl copolymer as an alkaline-soluble resin (an effective component 54%), 5 parts by weight of dipentaerythritol hexaacrylate being a photo or heat polymerizable monomer as a polyfunctional monomer and 2 parts by weight of 2-methyl-1-[4-(methylthio)phenyl]-2-morpholinopropane-1-one as a photo initiator and 15 parts by weight of propylene glycol monomethyl ether acetate) and 22 parts by weight of propylene glycol monomethyl ether acetate as a solvent, and the mixture was mixed to a homogeneous state, which was then filtered with a pressure filter having a mesh size of 0.2 µm, thereby obtaining a negative type resist composition A for color filter.

Examples 2 to 7, Comparative Examples 1 to 5

Negative type resist compositions B to L for color filters were obtained in the same manner as in Example 1, except that the pigment dispersion liquids B to L were used in place of the pigment dispersion liquid A.

[Evaluations]

With respect to the negative type resist compositions for the color filters obtained in Examples and Comparative Examples, the pigment dispersion stability and the alkaline developability were evaluated. Evaluation results are shown in Table 2.

(Evaluation of the Pigment Dispersion Stability)

To make evaluation of the pigment dispersion stability of the negative type resist compositions for the color filters prepared in Examples and Comparative Examples, the pigment dispersion liquid used for the preparation of the negative type resist composition for the color filter was kept still at 40° C. for a week, and particle diameters of the above pigment dispersion liquid were measured before and after the still keeping. The particle diameters were measured by using "Microtrac Particle Size Distribution Meter" manufactured by NIKKISO Co., Ltd.

(Evaluation of Alkaline Developability)

After the negative type resist composition for the color filter obtained in each run was coated in a thickness of 0.7 mm on a 10 mm×10 mm glass substrate (manufactured by NH Technoglass Corp., "NA35") by using a spin coater, it was dried with a hot plate at 80° C. for 3 minutes, thereby forming a red color layer in a thickness of 3.0 µm. This color layer was irradiated with 60 mJ/cm$^2$ ultraviolet rays by using a super high mercury lamp via photo mask. Thereafter, the glass plate formed with the above color layer was subject to shower development with a 0.05 mass % aqueous solution of potassium hydroxide as an alkaline-developing liquid, consequently the above color layer was completely dissolved out and the time period until that surface of the glass on which the above color layer had been formed appeared was measured as a developing time period.

As is clear through the comparison between Examples 1 to 7 and Comparative Examples 1 to 4, it was confirmed in Table 2 that in Examples 1 to 7, the alkaline-developing time periods were largely shortened and the alkaline developability was more excellent. Further, it was confirmed that since no growth of the pigment particles occurred at all with respect to the pigment dispersion liquids used for the preparation of the negative type resist compositions for the color filters in Examples 1 to 7, the dispersion stability is excellent.

Further, Comparative Example 5 using the block copolymer solution L forming no salt was gelled in the above dispersion evaluation of the pigment dispersion liquid, after being kept still for one week. Furthermore, since the particle diameters of the particles in the pigment dispersion liquid were so large that they could not be filtered with the pressure filter having the mesh size of 0.2 µm, the negative type resist composition for the color filter could not be prepared.

Example 8

In a 50 ml screw pipe, 0.025 part by weight of 2,2'-azobis (4-methoxy-2,4-dimethylvaleronitrile) (V-70, manufactured by Wako Pure Chemical Industries, Ltd.) was added to 30 parts by weight of the pigment dispersion liquid A obtained above, and the mixture was subjected to a reaction at 50° C. for 10 hours under application of ultrasonic waves, thereby obtaining a composite pigment dispersion liquid M in which double bonds contained in methacryloxyethyl acid phosphate as a salt-forming component were polymerized together.

Next, a negative type resist composition M for a color filter was obtained in the same manner as in Example 1, except that the composite pigment dispersion liquid M was used in place of the pigment dispersion liquid A.

[Evaluations]

With respect to the negative type resist composition M for the color filter obtained in Example 8, the pigment dispersion stability and the alkaline developability were evaluated. Evaluation results are shown in the above Table 2.

TABLE 2

| | | Evaluation of Dispersion stability of pigment | | Developing time |
| | | Particle diameter (nm) | Particle diameter (nm) | period |
| | Pigment dispersion liquid | before Stability test | after Stability test | (second) |
| --- | --- | --- | --- | --- |
| Example 1 | Pigment dispersion liquid A | 42 | 42 | 35 |
| Example 2 | Pigment dispersion liquid B | 43 | 42 | 35 |
| Example 3 | Pigment dispersion liquid C | 42 | 42 | 45 |
| Example 4 | Pigment dispersion liquid D | 42 | 42 | 40 |
| Example 5 | Pigment dispersion liquid E | 41 | 41 | 35 |
| Example 6 | Pigment dispersion liquid F | 44 | 44 | 45 |
| Example 7 | Pigment dispersion liquid G | 53 | 53 | 40 |
| Example 8 | Composite pigment dispersion liquid M | 54 | 54 | 25 |
| Comparative Example 1 | Pigment dispersion liquid H | 48 | 66 | 110 |
| Comparative Example 2 | Pigment dispersion liquid I | 41 | 45 | 120 |
| Comparative Example 3 | Pigment dispersion liquid J | 42 | 56 | 110 |
| Comparative Example 4 | Pigment dispersion liquid K | 42 | 46 | Developing impossible |
| Comparative Example 5 | Pigment dispersion liquid L | 300 | Gelled | — |

What is claimed is:

1. A negative resist composition for a color filter, comprising (A) a pigment dispersant, (B) a pigment, (C) an alkaline-soluble resin, (D) a polyfunctional monomer, (E) a photo initiator and (F) a solvent,
wherein the pigment dispersant (A) is a block copolymer comprising a constituting unit (1) represented by the following general formula (I) and a constituting unit (2) represented by the following general formula (II), and further wherein an amino group possessed by the constituting unit (1) and an acidic organic phosphorus compound represented by the general formula (III) react and form a salt,

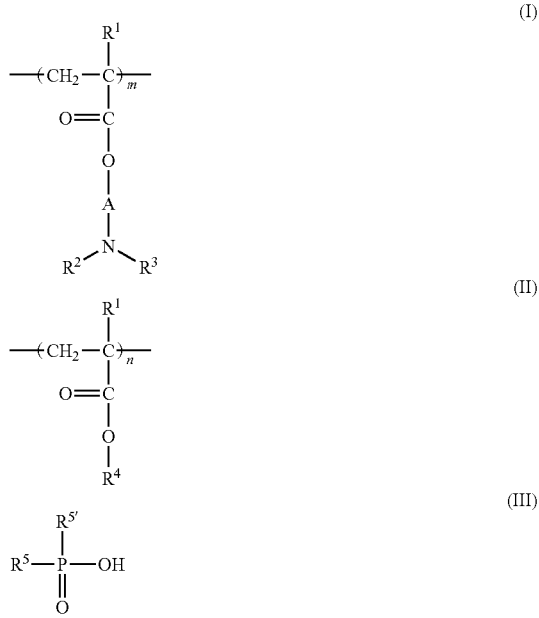

in the above formulae (I) to (III), $R^1$ is a hydrogen atom or a methyl group; $R^2$ and $R^3$ each and independently denote a hydrogen atom or a C1 to C8 alkyl group; A is a C1 to C8 alkylene group or a divalent group represented by $-[CH(R^6)-CH(R^7)-O)]_x-CH(R^6)-CH(R^7)-$ or $[(CH_2)_y-O]_z-(CH_2)_y-$; $R^4$ is a C1 to C18 alkyl group, a benzyl group, a phenyl group, a biphenyl group, $-[CH(R^6)-CH(R^7)-O]_x-R^8$ or $-[(CH_2)_y-O]_z-R^8$; $R^5$, $R^{5'}$ each and independently denote a hydrogen atom, a hydroxyl group, a C1 to C18 alkyl group, a C2 to C18 alkenyl group, a benzyl group, a phenyl group, a biphenyl group or a monovalent group represented by $-[CH(R^9)-CH(R^{10})-O]_a-R^{11}$ or $-[(CH_2)_b-O]_c-R^{11}$ or $-O-R^{5''}$;

$R^{5''}$ is a C1 to C18 alkyl group, a C2 to C18 alkenyl group, a benzyl group, a phenyl group, a biphenyl group or a monovalent group represented by $-[CH(R^9)-CH(R^{10})-O]_a-R^{11}$ or $-[(CH_2)_b-O]_c-R^{11}$;

$R^6$, $R^7$, $R^9$ and $R^{10}$ each and independently denote a hydrogen atom or a methyl group; $R^8$ and $R^{11}$ each and independently denote a hydrogen atom, a C1 to C18 alkyl group, a benzyl group, a phenyl group, a biphenyl group or a monovalent group represented by $-CHO$, $-CH_2CHO$, $-CO-CH=CH_2$, $-CO-C(CH_3)=CH_2$ or $-CH_2COOR^{12}$, provided that each group of $R^8$ and $R^{11}$ may have a substituent group; $R^{12}$ is a hydrogen atom or a C1 to C5 alkyl group;

"x" and "a" denote integers of 0 to 18, "y" and "b" denote integers of 1 to 5, "z" and "c" denote integers of 0 to 18, and "m" and "n" denote integers of 1 to 200, wherein a content of the acidic organic phosphorus compound is within the range of 0.05 molar equivalent to 4.0 molar equivalents relative to the amino group contained in the constituting unit (1).

2. The negative resist composition for a color filter according to claim 1, wherein the respective $R^5$ and $R^{5'}$ in the acidic organic phosphorus compound has a polymerizable group.

3. The negative resist composition for a color filter according to claim 2, wherein the polymerizable group is a vinyl group, a (metha)acryloyl group or an allyl group.

4. The negative resist composition for a color filter according to claim 2, wherein an average particle diameter of the pigment (B) is in a range of 10 nm to 100 nm.

5. A color filter comprising a color layer formed by using the negative resist composition for a color filter according to claim 2.

6. A liquid crystal display comprising the color filter according to claim 5.

7. The negative resist composition for a color filter according to claim 1, wherein an average particle diameter of the pigment (B) is in a range of 10 nm to 100 nm.

8. A color filter comprising a color layer formed by using the negative resist composition for a color filter according to claim 7.

9. A liquid crystal display comprising the color filter according to claim 8.

10. A color fitter comprising a color layer formed by using the negative resist composition for a color filter according to claim 1.

11. A liquid crystal display comprising the color filter according to claim 10.

12. The negative resist composition for a color filter according to claim 1, wherein either of $R^5$, $R^{5'}$ of the acidic organic phosphorus compound denotes a C1 to C18 alkyl group, and C2 to C18 alkenyl group, a benzyl group, a phenyl group, a biphenyl group or a monovalent group represented by $-[CH(R^9)-CH(R^{10})-O]_a-R^{11}$ or $-[(CH_2)_b-O]_c-R^{11}$ or $-O-R^{5''}$.

13. The negative resist composition for a color filter according to claim 12, wherein either of $R^5$, $R^{5'}$ of the acidic organic phosphorus compound contains an aromatic ring.

14. The negative resist composition for a color filter according to claim 13, wherein either of $R^5$, $R^{5'}$ of the acidic organic phosphorus compound is a phenyl group.

15. The negative resist composition for a color filter according to claim 14, wherein the acidic organic phosphorus compound is a phenylphosphonic acid.

* * * * *